United States Patent
Yao et al.

(10) Patent No.: US 10,241,409 B2
(45) Date of Patent: Mar. 26, 2019

(54) MATERIALS CONTAINING METAL OXIDES, PROCESSES FOR MAKING SAME, AND PROCESSES FOR USING SAME

(71) Applicant: AZ ELECTRONIC MATERIALS (LUXEMBOURG) S.A.R.L., Luxembourg (LU)

(72) Inventors: Huirong Yao, Plainsboro, NJ (US); M. Dalil Rahman, Flemington, NJ (US); Douglas McKenzie, Easton, PA (US); JoonYeon Cho, Bridgewater, NJ (US)

(73) Assignee: AZ Electronic Materials (Luxembourg) S.à.r.l., Luxembourg (LU)

( * ) Notice: Subject to any disclaimer, the term of this patent is extended or adjusted under 35 U.S.C. 154(b) by 284 days.

(21) Appl. No.: 14/978,232

(22) Filed: Dec. 22, 2015

(65) Prior Publication Data

US 2017/0176860 A1  Jun. 22, 2017

(51) Int. Cl.

| | |
|---|---|
| *C23C 18/08* | (2006.01) |
| *C23C 18/10* | (2006.01) |
| *C23C 18/12* | (2006.01) |
| *C09D 5/00* | (2006.01) |
| *G03F 7/09* | (2006.01) |
| *G03F 7/11* | (2006.01) |
| *C09D 1/00* | (2006.01) |

(52) U.S. Cl.
CPC ............ *G03F 7/11* (2013.01); *C09D 1/00* (2013.01); *C09D 5/006* (2013.01); *G03F 7/091* (2013.01)

(58) Field of Classification Search
CPC ..... C23C 18/08; C23C 18/10; C23C 18/1216; C09D 5/006; G03F 7/11; G03F 7/091
USPC .............................. 106/1.05, 1.12, 1.17, 1.18
See application file for complete search history.

(56) References Cited

U.S. PATENT DOCUMENTS

| | | |
|---|---|---|
| 4,491,628 A | 1/1985 | Ito et al. |
| 4,646,707 A | 3/1987 | Pfefferle |
| 5,350,660 A | 9/1994 | Urano et al. |
| 5,843,624 A | 12/1998 | Houlihan et al. |
| 6,447,980 B1 | 9/2002 | Rahman et al. |
| 6,576,302 B1* | 6/2003 | Mizuta ................ C23C 18/1216 427/492 |
| 6,723,435 B1 | 4/2004 | Horne et al. |
| 6,723,488 B2 | 4/2004 | Kudo et al. |
| 6,790,587 B1 | 9/2004 | Feiring et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,890,448 B2 | 5/2005 | Pavelchek |
| 6,916,590 B2 | 7/2005 | Kaneko et al. |
| 7,727,902 B2 | 6/2010 | Takei et al. |
| 7,905,114 B1 | 3/2011 | Horne et al. |
| 8,039,201 B2 | 10/2011 | Yao et al. |
| 9,201,305 B2* | 12/2015 | Rahman .................. G03F 7/091 |
| 9,315,636 B2* | 4/2016 | Yao ......................... G03F 7/091 |
| 2002/0192476 A1 | 12/2002 | Kambe et al. |
| 2003/0059684 A1* | 3/2003 | Takami ................. H01M 4/381 429/326 |
| 2003/0117691 A1 | 6/2003 | Bi et al. |
| 2003/0118841 A1 | 6/2003 | Horne et al. |
| 2003/0203205 A1 | 10/2003 | Bi et al. |
| 2005/0016839 A1 | 1/2005 | Horne et al. |
| 2005/0019504 A1 | 1/2005 | Bi et al. |
| 2005/0118411 A1 | 6/2005 | Horne et al. |
| 2006/0134347 A1 | 6/2006 | Chiruvolu et al. |
| 2006/0248665 A1 | 11/2006 | Pluyter et al. |
| 2009/0075083 A1 | 3/2009 | Bi et al. |
| 2010/0209328 A1 | 8/2010 | Bi et al. |
| 2010/0314588 A1 | 12/2010 | Kambe et al. |
| 2012/0012032 A1 | 1/2012 | Bi et al. |
| 2012/0202037 A1* | 8/2012 | Ryabova ............. C23C 18/1216 428/220 |
| 2012/0230900 A1* | 9/2012 | Saito ................... C23C 18/1216 423/263 |
| 2013/0012636 A1 | 1/2013 | Kambe et al. |
| 2013/0323413 A1* | 12/2013 | Yoshinaka .......... C23C 18/1216 427/126.3 |
| 2014/0047996 A1 | 2/2014 | Kambe |
| 2015/0137115 A1* | 5/2015 | Moon ................. C23C 18/1216 257/43 |

FOREIGN PATENT DOCUMENTS

| | | |
|---|---|---|
| EP | 2366736 A1 | 9/2011 |
| WO | 2014-086982 A2 | 6/2014 |
| WO | 2014-207142 A1 | 12/2014 |

OTHER PUBLICATIONS

Handbook of Semiconductor Manufacturing Technology Edited by Yoshio Nishi et al., Marcel Dekker Inc. 2000 p. 205, no month available.

International Search Report, PCT/EP2016/081970, dated Apr. 3, 2017.

* cited by examiner

*Primary Examiner* — Helene Klemanski

(74) *Attorney, Agent, or Firm* — Francis M. Houlihan

(57) ABSTRACT

Compositions having a high metal content comprising a metal salt solution, a stabilizer and one or more optional additives, wherein the metal salt solution comprises a metal ion, a counter ion and a solvent. The compositions are useful for forming films on substrates in the manufacture of solid state and integrated circuit devices.

13 Claims, No Drawings

MATERIALS CONTAINING METAL OXIDES, PROCESSES FOR MAKING SAME, AND PROCESSES FOR USING SAME

FIELD OF INVENTION

The present invention relates to materials useful in the manufacture of solid state and integrated circuit devices; processes for making same; and processes for using same. In particular, the present invention relates to materials for forming metal oxide containing films useful in the manufacture of solid state and integrated circuit devices; processes for making same; and processes for using same.

BACKGROUND

Metal oxide films are useful in a variety of applications in the semiconductor industry such as, for example, lithographic hard masks, underlayers for anti-reflective coatings and electro-optical devices. For example, photoresist compositions are used in microlithography processes for making miniaturized electronic components, such as in the fabrication of computer chips and integrated circuits. Generally, a thin coating of a photoresist composition is applied to a substrate, such as a silicon-based wafer used for making integrated circuits. The coated substrate is then baked to remove a desired amount of solvent from the photoresist. The baked, coated surface of the substrate is then imagewise exposed to actinic radiation, such as visible, ultraviolet, extreme ultraviolet, electron beam, particle beam or X-ray radiation. The radiation causes a chemical transformation in the exposed areas of the photoresist. The exposed coating is treated with a developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization.

Absorbing antireflective coatings and underlayers in photolithography are used to diminish problems that result from radiation that reflects from substrates which often are highly reflective. Reflected radiation results in thin film interference effects and reflective notching. Thin film interference, or standing waves, result in changes in critical line width dimensions caused by variations in the total light intensity in the photoresist film as the thickness of the photoresist changes. Interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations and, in extreme cases, forming regions with complete loss of desired dimensions. An antireflective coating film coated beneath a photoresist and above a reflective substrate provides significant improvement in lithographic performance of the photoresist. Typically, the bottom antireflective coating is applied on the substrate and cured, followed by application of a layer of photoresist. The photoresist is imagewise exposed and developed. The antireflective coating in the exposed area is then typically dry etched using various etching gases, and the photoresist pattern is thus transferred to the substrate.

Underlayers containing high amount of refractory elements can be used as hard masks as well as antireflective coatings. Hard masks are useful when the overlying photoresist is not capable of providing high enough resistance to dry etching that is used to transfer the image into the underlying semiconductor substrate. In such circumstances, a hard mask whose etch resistance is high enough to transfer any patterns created over it into the underlying semiconductor substrate can be employed. This is possible when the organic photoresist is different enough from the underlying hard mask so that an etch gas mixture can be found which will allow the transfer of the image in the photoresist into the underlying hard mask. This patterned hard mask can then be used with appropriate etch conditions and gas mixtures to transfer the image from the hard mask into the semiconductor substrate, a task which the photoresist by itself with a single etch process could not have accomplished.

Multiple antireflective layers and underlayers are being used in new lithographic techniques. In cases where the photoresist does not provide sufficient dry etch resistance, underlayers and/or antireflective coatings for the photoresist that act as a hard mask and are highly etch resistant during substrate etching are preferred. One approach has been to incorporate silicon, titanium, zirconium or other metallic materials into a layer beneath the organic photoresist layer. Additionally, another high carbon content antireflective or mask layer may be placed beneath the metal containing antireflective layer, to create a trilayer of high carbon film/hard mask film/photoresist. Such trilayers can be used to improve the lithographic performance of the imaging process.

Conventional hard masks can be applied by chemical vapor deposition, such as sputtering. However, the relative simplicity of spin coating versus the aforementioned conventional approaches makes the development of a new spin-on hard mask or antireflective coating with high concentration of metallic materials in the film very desirable.

Underlayer compositions for semiconductor applications containing metal oxides have been shown to provide dry etch resistance as well as antireflective properties. When higher concentrations of metal oxide are present in the underlayer, improved etch resistance and thermal conductance can be achieved. Conventional metal oxide compositions, however, have been found to be very unstable to moisture in air creating a variety of issues, including shelf life stability, coating problems and performance shortcomings. As well, conventional compositions generally contain non-metal oxide materials such as polymers, crosslinkers and other materials that detract from the metal oxide properties required for etch resistance and thermal conductivity. Thus, there is an outstanding need to prepare spin-on hard mask, antireflective and other underlayers that contain high levels of stable soluble metal oxides which are soluble or colloidally stable. It would be advantageous to provide such layers that have a high metal content. In addition, it would be advantageous to provide such layers that have excellent moisture resistance. Further, it would be advantageous to provide such layers with improved etch selectivity to SiOx with $CF_4$ or oxygen gas.

SUMMARY OF THE INVENTION

In one of its aspects, the present disclosure relates to a composition comprising a metal salt solution, a stabilizer and one or more optional additives. The metal salt solution comprises a metal ion, a counter ion and a solvent. The metal ion is selected from the group consisting of Zr, Al, Ti, Hf, W, Mo, Sn, In, Ga, Zn and combinations thereof. The counter ion is selected from the group consisting of nitrates, sulfates, acetates, fluorinated alkylacetates, fluorinated alkylsulfonates, acrylates, methacrylates and combinations thereof. The optional additive is selected from the group consisting of catalysts, crosslinkers, photoacid generators, organic polymers, inorganic polymers, surfactants, wetting agents, anti-foam agents, thixotropic agents and combinations thereof.

In certain variations, the composition has an organic content that is no more than about 20%, no more than about 10%, or no more than about 5%.

In certain variations, the composition has a total solid content ranging from about 2% to about 40%. In other variations, the composition has a total solid content ranging from about 5% to about 35%. In other variations, the composition has a total solid content ranging from about 5% to about 25%.

In certain variations, the metal ion is Zr. In certain variations, the metal ion is Al.

In certain variations, the counterion is a sulfonate. In other variations, the counterion is a nitrate.

In certain variations, the metal salt is zirconyl nitrate. In certain variations, the metal salt is aluminum nitrate. In certain variations, the metal salt is zirconyl methacrylate. In certain variations, the metal salt is aluminum sulfate. In certain variations, the metal salt is titanium oxysulfate. In certain variations, the metal salt is aluminum trifluoroacetate. In certain variations, the metal salt is aluminum trifluoromethylsulfonate.

In certain variations, the solvent is water, an alcohol, an ester, an alkylcarboxylic acid, a ketone, a lactone, a diketone, or a combination thereof. In other variations, the solvent is a cyclohexanone, a propylene glycol monomethyl ether acetate (PGMEA), a propylene glycol monomethyl ether (PGME) or a combination thereof.

In certain variations, the stabilizer includes a lactone. In particular variations, the lactone is selected from the group consisting of α-acetolactone, β-propiolactone, gamma-valerolactone, gamma-butyrolactone and combinations thereof. In certain variations, the lactone is present in the composition at a content of no more than 20%. In other variations, the lactone is present in the composition at a content of no more than 10%.

In certain variations, the stabilizer includes a carboxylic acid. In particular variations, the carboxylic acid is selected from the group consisting of acetic acid, propionic acid, isobutyric acid and combinations thereof. In certain variations, the carboxylic acid is present in the composition at a content of no more than 20%. In other variations, the carboxylic acid is present in the composition at a content of no more than 10%.

In another of its aspects, the present disclosure relates to a process for making a composition comprising a metal salt solution wherein the metal salt is dissolved in a mixture comprising a solvent and a stabilizer to form a solution. In certain variations, the metal salt is dissolved in the solvent prior to adding the stabilizer. In other variations, the stabilizer is added to the solvent prior to dissolving the metal salt in the solvent. In certain variations, the solution is filtered before the step of adding the stabilizer. In certain variations, the metal salt is dissolved in a pre-solvent prior to dissolving the metal salt in the solvent. In particular variations, the pre-solvent is selected from the group consisting of alcohols, esters, alkylcarboxylic acids, ketones, lactones, diketones, and combinations thereof. In certain variations, the boiling point of the pre-solvent is lower than about 100° C., or lower than about 70° C. In certain variations, at least a portion of the pre-solvent, or at least about 95% of the pre-solvent, or at least about 98% of the pre-solvent, is removed. In certain variations, the metal salt-pre-solvent solution is filtered.

In yet another of its aspects, the present disclosure relates to a process for making an aluminum trifluoromethylsulfonate composition wherein aluminum trifluoromethylsulfonate is dissolved in a mixture comprising a solvent and a lactone to form a solution of aluminum trifluoromethylsulfonate in the mixture of the lactone and the solvent. In certain variations, the dissolving step is conducted at 40-60° C. In certain variations, the dissolving step is conducted for 2-6 hours. In certain variations, the solution is filtered before the step of adding the lactone.

In still another of its aspects, the present disclosure relates to a process for making a zirconyl nitrate composition wherein zirconyl nitrate hydrate is dissolved in a mixture comprising a solvent and a carboxylic acid to form a solution of zirconyl nitrate in the mixture of the carboxylic acid and the solvent. In certain variations, the solution is filtered before the step of adding the carboxylic acid.

In even another of its aspects, the present disclosure relates to a process for coating a substrate wherein a composition as described herein is coated on the substrate; and the coated substrate is heated to form a cured film. In certain embodiments, the metal oxide content of the cured film is between 20% and 90% based on the total weight of the cured film. In other variations, the metal oxide content of the cured film is between 40% and 85% based on the total weight of the cured film. In certain variations, the coated substrate is heated at a temperature between 150° C. and 500° C. In other variations, the coated substrate is heated at a temperature between 250° C. and 350° C.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "and/or" refers to any combination of the foregoing elements including using a single element.

As used herein the phrase "high metal oxide content" means a content higher than about 50%, preferably higher than about 60%, and more preferably higher than about 70%, based on weight percentages.

The present disclosure relates to a composition comprising a metal salt solution; a stabilizer; and one or more optional additives. The metal salt solution comprises a metal ion, a counter ion; and one or more solvents.

Suitable metal ions include, but are not limited to, Zr, Al, Ti, Hf, W, Mo, Sn, In, Ga, Zn and combinations thereof. In certain embodiments, the metal ion is Zr. In other embodiments, the metal ion is Al.

More than one metal may be included in the composition depending on the desired properties of the final crosslinked layer. For example, zirconium and titanium may be combined to give a layer with very good etch resistance, thermal conductivity and high refractive index.

Suitable counter ions include, but are not limited to, nitrates, sulfates, acetates, fluorinated alkylacetates, fluorinated alkylsulfonates, acrylates, methacrylates and combinations thereof. In certain embodiments, the counterion includes, but is not limited to, sulfates. In other embodiments, the couterion includes, but is not limited to, nitrates.

In select embodiments, the metal salt includes, but is not limited to, zirconyl nitrate, aluminum nitrate, zirconyl methacrylate, aluminum sulfate, titanium oxysulfate, aluminum trifluoroacetate, aluminum trifluoromethylsulfonate, and combinations thereof. In particular, the metal salt can be zirconyl nitrate. Additionally, the metal salt can be aluminum trifluoromethyl sulfonate.

Suitable solvents include, but are not limited to, solvents that are typically used in lithographic spin-on processes. Examples of suitable solvents for the current disclosure include, but are not limited to, ethers, esters, ether esters, ketones, ketone esters, and combinations thereof. More specifically, suitable solvents include, but are not limited to, ethylene glycol monoalkyl ethers, diethylene glycol dialkyl ethers, propylene glycol monoalkyl ethers, propylene glycol dialkyl ethers, acetate esters, hydroxyacetate esters, lactate esters, ethylene glycol monoalkylether acetates, propylene glycol monoalkylether acetates, alkoxyacetate esters, cyclic ketones, non-cyclic ketones, acetoacetate esters, pyruvate esters and propionate esters. The aforementioned solvents may be used independently or as a mixture of two or more. Furthermore, in particular embodiments, at least one high boiling point solvent, such as benzylethyl ether, dihexyl ether, diethylene glycol monomethyl ether, diethylene glycol monoethyl ether, acetonylacetone, caproic acid, capric acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenylcellosolve acetate, is added.

In particular, the solvent can include water, alcohols, esters, alkylcarboxylic acids, ketones, lactones, diketones, and combinations thereof. In a further embodiment, the solvent includes cyclohexanone. In yet a further embodiment, the solvent includes propylene glycol monomethyl ether acetate. In still a further embodiment, the solvent includes propylene glycol monomethyl ether. In even a further embodiment, the solvent includes propylene glycol monomethyl ether acetate and propylene glycol monomethyl ether. In particular embodiments, the solvent has a boiling point of about 120° or higher, or about 140° or higher.

In certain embodiments, the stabilizer is selected to enhance desired properties in a coating formed from the composition. Accordingly, a variety of stabilizers known in the art can be used. In certain embodiments, the stabilizer includes a lactone. In particular, suitable lactones include, but are not limited to, α-acetolactone, β-propiolactone, gamma-valerolactone, and gamma-butyrolactone. In other embodiments, the stabilizer includes a carboxylic acid. In particular, suitable carboxylic acids include, but are not limited to, acetic acid, propionic acid, and isobutyric acid. Those skilled in the art would appreciate that one or more additional stabilizers can be used in order to enhance other beneficial properties of the composition and/or final coating. Accordingly, in particular embodiments, the stabilizer is selected from the group consisting of α-acetolactone, β-propiolactone, gamma-valerolactone, gamma-butyrolactone, acetic acid, propionic acid, and isobutyric acid.

In certain embodiments, the metal ion is Al and the stabilizer is selected from the group consisting of gamma-valerolactone, α-acetolactone, β-propiolactone, and gamma-butyrolactone. In certain embodiments, the metal ion is Zr and the stabilizer is selected from the group consisting of propionic acid, acetic acid, and isobutyric acid.

As would be appreciated by those skilled in the art, the content of the stabilizer in the composition can be varied. In particular embodiments, the stabilizer is present in the composition at a content of no more than 20%. In other embodiments, the stabilizer is present in the composition at a content of no more than 10%.

The one or more optional additives can be selected from a variety of additives that enhance the desired properties of the compositions and/or final coatings formed from the compositions. In particular, the one or more optional additives include, but are not limited to, catalysts, crosslinkers, photoacid generators, organic polymers, inorganic polymers, surfactants, anti-foam agents, thixotropic agents and combinations thereof.

Suitable catalysts include, but are not limited to, thermal acid generators, peroxides and combinations thereof.

A thermal acid generator is a compound which is capable of generating an acidic moiety when heated. The thermal acid generator can be nonionic or ionic. Suitable nonionic thermal acid generators include, for example, cyclohexyl p-toluenesulfonate, methyl p-toluenesulfonate, cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, alkyl esters of organic sulfonic acids such as p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and combinations thereof. Suitable ionic thermal acid generators include, for example, dodecylbenzenesulfonic acid triethylamine salts, dodecylbenzenedisulfonic acid triethylamine salts, p-toluene sulfonic acid-ammonium salts, sulfonate salts, such as carbocyclic aryl (e.g., phenyl, napthyl, anthracenyl, etc.) and heteroaryl (e.g., thienyl) sulfonate salts, aliphatic sulfonate salts and benzenesulfonate salts. The amount of thermal acid generator can be present in total amounts of between about 1 about 5% based on solids.

Suitable peroxides include, but are not limited to, inorganic peroxides such as hydrogen peroxide, metal peroxides (e.g., peroxides of group I or group II metals), organic peroxides such as benzoyl peroxide, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(t-cumylperoxycarbonyl)benzophenone, 3,3',4,4'-tetra(t-isopropylcumylperoxycarbonyl)benzophenone and di-t-butyldiperoxyisophthalate, and peroxyacids such as peroxymonosulphuric acid and peroxydisulphuric acid, and combinations thereof. The amount of peroxide can be present in total amounts of between about 1 about 10% based on solids.

Suitable crosslinkers include, for example, di-, tri-, tetra-, or higher multi-functional ethylenically unsaturated monomers. Crosslinkers useful in the present disclosure include, for example: trivinylbenzene, divinyltoluene; divinylpyridine, divinylnaphthalene, divinylxylene, ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol diacrylate, tetraethylene glycol dimethacrylate, polyethylene glycol dimethacrylate, ethoxylated bisphenol A diacrylate, ethoxylated bisphenol A dimethacrylate, polyethylene glycol dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly(phenyl vinyl siloxane), tetra($C_1$-$C_8$)alkoxyglycoluril such as tetramethoxyglycoluril and tetrabutoxyglycoluril, and combinations thereof. In particular embodiments, crosslinkers include, but are not limited to, glycouril, malemine, multiepoxy, multihydroxyl, multi carboxylic acid, and combinations thereof. In select embodiments, the crosslinker is present in an amount of from about 1 to about 10 wt %, or from about 2 to about 5 wt % based on the total solids of the composition.

A photoacid generator is a compound which is capable of generating an acidic moiety when exposed to activating radiation. Suitable photoacid generators include, for example, sulfide and onium type compounds. Photoacid generators include, but are not limited to, diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, (4-tbutylphenyl) tetramethylenesulfonium (3-hydroxyadamantanyl ester)-tetrafluoro-butanesulfonate), (4-tbutylphenyl) tetramethylenesulfonium (adamantanyl ester)-tetrafluoro-butanesulfonate) and dibutylnaphthylsulfonium triflate. The amount of photoacid generator can be present in total amounts of between about 1 about 10% based on solids.

The metal oxide compositions of the current disclosure may further contain an organic or inorganic polymer capable of crosslinking during heat treatment, wherein the metal oxide thermally decomposes while the polymer thermally crosslinks to give a composite film with high metal oxide content. Polymers such as film forming organic or silicon based polymers can be used, such as, for example, polyacrylics, polymethacrylates, and condensation polymers such as polyesters, novolac resins, siloxane resins or organosilsesquioxanes. These polymers may be used alone or in combination with each other, depending on the desired properties of the final film after curing. These polymers are generally crosslinking polymers, containing any of a number of the same or different crosslinking substituents, such as, for example, epoxies, hydroxyls, thiols, amines, amides, imides, esters, ethers, ureas, carboxylic acids, anhydrides, and the like. Other examples of crosslinking groups include glycidyl ether groups, glycidyl ester groups, glycidyl amino groups, methoxymethyl groups, ethoxy methyl groups, benzyloxymethyl groups, dimethylamino methyl groups, diethylamino methyl groups, dimethylol amino methyl groups, diethylol amino methyl groups, morpholino methyl groups, acetoxymethyl groups, benzyloxy methyl groups, formyl groups, acetyl groups, vinyl groups and isopropenyl groups. Polymers disclosed in U.S. Pat. No. 8,039,201 and incorporated herein by reference may be used.

Suitable organic polymers include, but are not limited to, polyacrylic, polymethacrylate, polyvinylalcohol, polyvinylpyrridone, condensation polymers and combinations thereof. In addition, suitable condensation polymers include, but are not limited to, polyester, novolac resin, and combinations thereof. In particular embodiments, the organic polymer includes a crosslinkable group. Suitable crosslinkable groups include, but are not limited to, hydroxyls, epoxys, amides, ureas, carboxylic acids, lactones, pyrridones, and combinations thereof. Besides the crosslinkable groups, the organic polymer can contain fluoroalkyl or fluoroalcohol groups. The amount of organic polymer can be present in total amounts of between about 3 about 25% based on solids.

Suitable inorganic polymers include, but are not limited to, hydrogen silsesquioxane (HSSQ), methyl silsesquioxane (MSSQ), and combinations thereof. The amount of inorganic polymer can be present in total amounts of between about 3 about 25% based on solids.

The resist underlayer film-forming composition of the present disclosure may contain a surfactant as an optional component to improve application properties to a substrate. Examples of the surfactant may include a nonionic surfactant including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, a fluorosurfactant such as EFTOP® EF301, EF303, and EF352 (manufactured by Mitsubishi Materials Electronic Chemicals Co., Ltd.), MEGAFAC® F171, F173, R-30, R-30N, and R-40 (manufactured by DIC Corporation), Fluorad FC-430 and FC431 (manufactured by Sumitomo 3M, Ltd.), Asahi Guard® AG710, and Surflon S-382, SC101, SC102, SC103, SC104, SC105, and SC106 (manufactured by Asahi Glass Co., Ltd.), and organosiloxane polymer KP341 (manufactured by Shin-Etsu Chemical Co., Ltd.). These surfactants may be used singly or two or more of them may be used in combination. When a surfactant is used, the content of the surfactant is, for example, about 0.01 to about 5% by mass, or about 0.05 to about 2% by mass.

Suitable anti-foam agents include, but are not limited to, silicones including, but not limited to, polysiloxanes, petroleum hydrocarbons, acetylenics, vinyl polymers and polyalkoxylates.

Suitable thixotropic agents include, but are not limited to, anhydrous silica and colloidal silica. In particular, the anhydrous silica can have silanol groups on the surface thereof in the form of fine powder (average particle size: about 1 to about 50 μm). The amount of the thixotropic agent can be about 1 to about 20, or about 2 to about 10, parts by weight of the total solid of the composition.

Those skilled in the art would appreciate that, when present, the content of the one or more optional additives can be varied in order to enhance the desired properties of the composition without deleteriously affecting the overall performance of the composition. For example, the crosslinkability and optical parameters can be adjusted. The composition can be fine-tuned so that films formed from the composition pass soaking tests in the casting solvent without additional crosslinking agents and/or catalysts. The optical parameters can be adjusted such that n=1.3-2.3 and k=0-0.8 at 193 nm. In particular embodiments, the one or more optional additives can be present in the composition at a content of no more than 30. In further embodiments, the one or more optional additives can be present in the composition at a content of no more than 20%. In still further embodiments, the one or more optional additives can be present in the composition at a content of no more than 10%. In yet further embodiments, the one or more optional additives can be present in the composition at a content of no more than 5%. In even further embodiments, the one or more optional additives can be present in the composition at a content of no more than 1%.

In certain embodiments, the composition has a low organic content. In particular embodiments, the presence of organic compounds with high molecular weights and/or high boiling points, as compared to the solvent and the stabilizer, is low. In more specific embodiments, the organic content is no more than about 20%, no more than about 10%, or no more than about 5%.

In certain embodiments, the composition has a total solid content ranging from about 2% to about 40%. In other embodiments, the composition has a total solid content ranging from about 5% to about 35%.

The present disclosure also relates to a process for making a composition comprising a metal salt solution. The present invention also includes a process for preparing the metal salt solution in common organic solvents, which can remove trace insoluble impurities and improve the material processing. According to the process, the metal salt is dissolved in a solvent to form a solution; and a stabilizer is added. In certain embodiments, the metal salt is dissolved in the solvent prior to adding the stabilizer. In other embodiments, the stabilizer is added together with the solvent dissolving the metal salt.

In certain embodiments, the metal salt is dissolved in a pre-solvent prior to dissolving the metal salt in the solvent. Suitable pre-solvents include, but are not limited to, alcohols, esters, ketones, lactones, diketones, and combinations thereof. In certain embodiments, the pre-solvent has a boiling point lower than the boiling point of the solvent and, in particular, lower than about 100° C. or lower than about 70° C. In particular, the pre-solvent can be acetone. The process can also include the step of filtering the metal salt-presolvent solution.

In certain embodiments, at least a portion of the presolvent, or at least about 95% of the pre-solvent, or at least about 98% of the pre-solvent is removed using any of a variety of known methods. For example, at least a portion of the pre-solvent can be removed by evaporation. In particular, the evaporation can be carried out using a rotary evaporator.

In addition, the present disclosure relates to a process for making an aluminum trifluoromethylsulfonate composition wherein aluminum trifluoromethylsulfonate is dissolved in a mixture comprising a solvent and a lactone to form a solution. In particular embodiments, the dissolving step is conducted at 40-60° C. In particular embodiments, the dissolving step is conducted for 2-6 hours. The metal salt is optionally dissolved in a pre-solvent, as described above.

Further, the present disclosure relates to a process for making a zirconyl nitrate composition wherein zirconyl nitrate hydrate is dissolved in mixture comprising a solvent and a carboxylic acid to form a solution. In particular embodiments, the dissolving step is conducted at 40-60° C. In particular embodiments, the dissolving step is conducted for 2-6 hours. The metal salt is optionally dissolved in a pre-solvent, as described above.

Even further, the present disclosure relates to a process for coating a substrate wherein a composition as described in the present disclosure is applied on the substrate; and the coated substrate is heated to form a cured film. The cured metal oxide film can have a metal content of at least about 25 wt %, or at least about 50 wt %, or at least about 70 wt %, based on the total weight of the cured film. For example, the cured metal oxide film can have a metal content of between about 25% to about 80%, or about 30% to about 70%, based on the total weight of the cured film. In particular, cured zirconium or aluminum oxide films formed from the novel composition have a metal content of at least about 30 wt %, or at least about 50 wt %, or at least about 60 wt %, based on the total weight of the cured film.

Suitable substrates include, but are not limited to, low dielectric constant materials, silicon, silicon substrates coated with a metal surface, copper coated silicon wafers, copper, aluminum, polymeric resins, silicon dioxide, metals, doped silicon dioxide, silicon nitride, tantalum, polysilicon, ceramics, aluminum/copper mixtures, any of the metal nitrides such as AlN, gallium arsenide and other Group III/N compounds. The substrate may also contain antireflective coatings or underlayers, such as high carbon underlayers coated over the above mentioned substrates. Further, the substrate may comprise any number of layers made from the materials described above.

The compositions of the current disclosure are coated on the substrate using techniques well known to those skilled in the art, such as dipping, spin coating, curtain coating, slot coating, spraying and the like. The film thickness of the coating ranges from about 5 nm to about 1000 nm, or about 10 nm to about 500 nm or about 50 nm to 400 nm. In certain embodiments, the metal ion is Al; the stabilizer is selected from the group consisting of gamma-valerolactone, α-acetolactone, β-propiolactone, and gamma-butyrolactone; and the film thickness is at least about 10 nm, or at least about 50 nm.

The coated metal oxide composition is then heated (for example, on a hot plate or convection oven) at curing temperatures. The cure temperature may be from about 200° C. to about 550° C., or from about 300° C. to about 450° C. The cure time may be for about 1 to about 10 minutes, or about 1 to about 2 minutes. The composition may be coated over other layers of antireflective coatings, such as a high carbon content (greater than about 80% or about 85% or about 90%) antireflective coating. Once cooled, other materials can be coated onto the surface of the metal oxide such as, for example, photoresists.

The cured metal oxide film can be removed using a stripping agent, including, for example, 85% phosphoric acid, 3% HF, 10% TMAH, 10% hydrogen peroxide, aqueous alkaline peroxides and combinations thereof. Stripping times range from about 30 seconds to about 120 seconds at about room temperature to about 70° C., depending on the film curing conditions. However, it will be understood that other stripping processes and processing conditions may be employed. For example, the stripper may be diluted, the time may be shortened and/or the temperature of stripping may be reduced.

The metal oxide compositions of the current disclosure can be used to prepare lithographic antireflective layers and high K dielectric materials in electro-optical devices. An underlayer formed from the present compositions can have a refractive index (n) ranging from about 1.3 to about 2.3 and an extinction coefficient (k) ranging from about 0 to about 0.8, at 193 nm exposure wavelength.

The refractive index (n) (refractive index) and k (extinction coefficient) are parameters which relate to the complex refractive index $n_c$ as follows:

$$n_c = n - jk$$

(Handbook of Semiconductor Manufacturing Technology Edited by Yoshio Nishi et al, Marcel Dekker Inc, 2000 page 205). The n and k values can be calculated using an ellipsometer, such as the J. A. Woollam VASE32® Ellipsometer. The exact values of the optimum ranges for k and n are dependent on the exposure wavelength used and the type of application. Typically for 193 nm, the preferred range for k is about 0.1 to about 0.6, and for 248 nm the preferred range for k is about 0.15 to about 0.8, however, other exposure wavelengths such as, for example DUV and beyond DUV can be used and the compositions tuned to work in conjunction with them.

One or more photoresist compositions can be applied over the cured film of the present disclosure by any of a variety of processes, such as spin coating, and the like, as described herein. After coating, the solvent is removed to a level wherein the coating can be properly exposed. In some cases, a residual of about 5% solvent may remain in the coating, while in other cases less than 1% is desired. Drying can be accomplished by hot plate heating, convection heating, infrared heating and the like. The coating is imagewise exposed with actinic radiation through a mask containing a desired pattern. An edge bead remover may be applied after the coating steps to clean the edges of the substrate using processes well known in the art.

Photoresists can be any of the types used in the semiconductor industry, provided the photoactive compound in the photoresist and the antireflective coating substantially absorb at the exposure wavelength used for the imaging process. In some embodiments, photoresists useful for immersion lithography are used. Typically, photoresists suitable for imaging with immersion lithography may be used, where such photoresists have a refractive index higher than about 1.85 and also are hydrophobic having water contact angle in the range of 75° to 95°.

Several major deep ultraviolet (uv) exposure technologies have provided significant advancement in miniaturization, and have actinic radiation of 250 nm to 10 nm, such as 248 nm, 193 nm, 157 and 13.5 nm. Chemically amplified photoresists are often used. Photoresists for 248 nm have typically been based on substituted polyhydroxystyrene and its copolymers/onium salts, such as those described in U.S. Pat. Nos. 4,491,628 and 5,350,660. On the other hand, photoresists for exposure at 193 nm and 157 nm require non-aromatic polymers since aromatics are opaque at this wavelength. U.S. Pat. Nos. 5,843,624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, but they also provide transparency at low wavelengths and they have relatively high glass transition temperatures. U.S. Pat. No. 5,843,624 discloses polymers for photoresists that are obtained by free radical polymerization of maleic anhydride and unsaturated cyclic monomers. Any of the known types of 193 nm photoresists may be used, such as those described in U.S. Pat. Nos. 6,447,980 and 6,723,488. Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. In addition, a class of 157 nm fluoroalcohol polymers has been described in which the polymer backbone is derived from the cyclopolymerization of an asymmetrical diene such as 1,1,2,3,3-pentafluoro-4-trifluoromethyl-4-hydroxy-1,6-heptadiene (U.S. Pat. No. 6,818,258) or copolymerization of a fluorodiene with an olefin (U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art. Thus, photoresists absorbing in the range of about 12 nm to about 250 nm are useful.

The novel coatings can also be used in processes with nanoimprinting and e-beam resists.

After the coating process, the photoresist can be imagewise exposed. The exposure may be done using typical exposure equipment. The exposed photoresist is then developed in an aqueous developer to remove the treated photoresist. The developer is preferably an aqueous alkaline solution comprising, for example, tetramethylammonium hydroxide (TMAH), typically 2.38 wt % TMAH. The developer may further comprise surfactant(s). An optional heating step can be incorporated into the process prior to development and after exposure.

The process of coating and imaging photoresists is well known to those skilled in the art and is optimized for the specific type of photoresist used. The photoresist patterned substrate can then be dry etched with an etching gas or mixture of gases, in a suitable etch chamber to remove the exposed portions of the underlayers and optional other antireflective coatings. Various etching gases are known in the art for etching underlayer coatings, such as those comprising $O_2$, $CF_4$, $CHF_3$, $Cl_2$, HBr, $SO_2$, CO, etc. In one embodiment, the article comprises a semiconductor substrate with a high carbon antireflective film, over which the film of the present disclosure is coated. A photoresist layer is coated above this. The photoresist is imaged as disclosed above and the metal underlayer is dry etched using gases comprising fluorocarbons. After the metal underlayer is etched, the high carbon film can be dry etched using oxygen or oxygen mixtures. Advantageously, the film of the present disclosure may be removed using a stripper which is a chemical solution, as described herein.

Each of the documents referred to above are incorporated herein by reference in its entirety, for all purposes. The following specific examples will provide detailed illustrations of the methods of producing and utilizing compositions of the present disclosure. These examples are not intended, however, to limit or restrict the scope of the invention in any way and should not be construed as providing conditions, parameters or values which must be utilized exclusively in order to practice the present invention.

EXAMPLES

Refractive indices (n) and extinction coefficients (k) were measured on a J. A. Woollam VASE32® Ellipsometer.

TGA analysis was done using a Perkin Elmer-TGA7-Thermogravimeteric Analyser in the presence of oxygen from 50-900° C. Images of the coatings were obtained using scanning electron microscopy (SEM) by cutting the wafers in a direction at a right angle to the longitudinal direction of the grooves, and observing the sectional groove part using a scanning electron microscope MODEL S-5000, manufactured by Hitachi, Ltd., at a magnification of 150000 times in a direction perpendicular to the section.

Formulation and Coating Example 1

20% wt/wt solutions of zirconyl nitrate hydrate $ZrO(NO_3)_2 \cdot xH_2O$ (x~6) from Sigma-Aldrich Corp. was dissolved in a solvent of ArF thinner (PGMEA/PGME 70:30): propionic acid 15:1 and heated to 50° C. with stirring for 6 h. The solution was cooled down, filtered, spin-coated on a silicon wafer and baked at 300° C. for 60 seconds. The coated wafer showed good coating quality by SEM. The refractive index (n) and the absorption (k) values of the antireflective coating were measured to be n=2.17 and k=0.44 on a J. A. Woollam VASE32 ellipsometer. The samples were aged at 40° C. for 1 week. The coating quality and film thickness at 300° C./60 s have not shown changes by SEM.

Comparative Formulation and Coating Example 1

20% wt/wt solutions of zirconyl nitrate hydrate $ZrO(NO_3)_2 \cdot xH_2O$ (x~6) from Sigma-Aldrich Corp. were dissolved in a solvent of ArF thinner and heated to 50° C. with stirring for 6 h. The solution was cooled down, filtered, spin-coated on a silicon wafer, and baked at 300° C. for 60 seconds. The coated wafer shows good coating quality with a film thickness of 138 nm by SEM. The samples was aged at 40° C. for 1 week. The coating quality and film thickness at 300° C./60 s was evaluated by SEM showing that the film thickness increases to 168 nm (22% difference).

Formulation and Coating Example 2

The 20% wt/wt solution from Formulation and Coating Example 1 was diluted to 3.6 wt/wt % in ArF thinner solvent. After sufficient mixing, the solution was filtered, spin-coated on a silicon wafer and baked at 300° C. for 60 seconds. The coated wafer shows good coating quality by SEM. The refractive index (n) and the absorption (k) values of the antireflective coating were measured to be n=2.12 and k=0.45 on a J. A. Woollam VASE32 ellipsometer.

Formulation and Coating Example 3

20% wt/wt solutions of Zirconyl nitrate hydrate $ZrO(NO_3)_2 \cdot xH_2O$ (x~6) from Sigma-Aldrich Corp. was dissolved in a solvent of water:propionic acid 15:1 and heated to 50° C. with stirring for 4-5 h. The solution was cooled down and 0.05% of Megafac 82011 (Dainippon ink and Chemicals, Inc.) was mixed in the solution. The solution was filtered and spin-coated on a silicon wafer and baked at 300° C. for 60 seconds. The coated wafer shows good coating quality by SEM. The refractive index (n) and the absorption (k) values of the antireflective coating were measured to be n=2.14 and k=0.35 on a J. A. Woollam VASE32 ellipsometer.

Formulation and Coating Example 4

5% wt/wt solution of aluminum trifluoromethylsulfonate was dissolved in ArF thinner under ultrasonic conditions. After sufficient mixing for several days, the solution was filtered and spin-coated on a silicon wafer and baked at 350° C. for 60 seconds. The coated wafer shows good coating quality by SEM. The refractive index (n) and the absorption (k) values of the antireflective coating were measured to be n=1.47 and k=0.04 on a J. A. Woollam VASE32 ellipsometer.

Formulation and Coating Example 5

10% wt/wt solution of aluminum trifluoromethylsulfonate was dissolved in ArF thinner:gamma-valerolactone (GVL) 90:10, mixed at 50° C. for 6 h, filtered, spin-coated on a silicon wafer and baked at 350° C. for 60 seconds. The coated wafer shows good coating quality by SEM. The refractive index (n) and the absorption (k) values of the antireflective coating were measured to be n=1.33 and k=0.01 on a J. A. Woollam VASE32 ellipsometer.

Comparative Formulation and Coating Example 5A

10% wt/wt solution of aluminum trifluoromethylsulfonate was dissolved in ArF thinner and heated at 50° C. for 6 h. The solution was filtered, spin-coated on a silicon wafer and baked at 350° C. for 60 seconds. The coated wafer showed defects by SEM.

Comparative Formulation and Coating Example 5B

10% wt/wt solution of aluminum trifluoromethylsulfonate was dissolved in ArF thinner under ultrasonic conditions. The solution was filtered, spin-coated on a silicon wafer and bakes at 350° C. for 60 seconds. The coated wafer showed defects by SEM.

Formulation and Coating Example 6

40 g of zirconyl nitrate hydrate $ZrO(NO_3)_2 \cdot xH_2O$ (x~6) from Sigma-Aldrich Corp. was dissolved in 160 g of acetone by rolling the mixture solution over weekend. The solution was then filtered. The solution was then added to a 500 mL single neck flask containing 160 g of cyclohexanone. 10 g of propionic acid was added to the above mixture slowly and mixed well. Acetone was evaporated by rotary evaporator. The final solution was weighed to be 188 g. The solid content (zirconyl nitrate) was measured to be 12.5%.

Formulation Example 6 was filtered and spin-coated on a silicon wafer and bake at 300° C. for 60 seconds. The coated wafer shows good coating quality by SEM. The refractive index (n) and the absorption (k) values of the antireflective coating were measured to be n=2.15 and k=0.44 on a J. A. Woollam VASE32 ellipsometer.

Formulation and Coating Example 7

40 g of zirconyl nitrate hydrate $ZrO(NO_3)_2 \cdot xH_2O$ (x~6) from Sigma-Aldrich Corp. was dissolved in 160 g of acetone by rolling the mixture solution over weekend. The solution was then filtered. The solution was then added to a 500 mL single neck flask containing 160 g of PGMEA/PGME70:30. 10 g of propionic acid was added to the above mixture slowly and mixed well. Acetone was evaporated by rotary evaporator. The final solution was weighed to be 190 g. The solid content (zirconyl nitrate) was measured to be 12.6%.

Formulation Example 7 was filtered and spin-coated on a silicon wafer and baked at 300° C. for 60 seconds. The coated wafer shows good coating quality by SEM. The refractive index (n) and the absorption (k) values of the antireflective coating were measured to be n=2.16 and k=0.45 on a J. A. Woollam VASE32 ellipsometer.

Determination of Metal Content in Films after Baking

Formulation examples 1, 3 and 5 were coated on a silicon wafer and baked at at 250° C./60 s-350° C./60 s. The metal contents in the films were measured by elemental analysis and TGA weight loss measurement. The results from both measurements were consistent and indicated that the measured total metal content ranged from 25 to 60 wt % in films at 250° C./60 s-350° C./60 s baking conditions.

Etch Rate Evaluation of Example 1

The bulk etch rates of MHM films including $SiO_2$ as reference were measured on either ICP or CCP etcher at IMEC for various MHM samples. The etch conditions for $CF_4$ gas is 10 mT/450 W/100V/30 s/100° $CF_4$/60° C. and the etch time is 30 seconds. The etch rates of MHM material at various temperature is tabulated as following.

| Substrate | Process Condition | Dry Etch Rate (nm/min) |
|---|---|---|
| SiOX | | 52.2 |
| Coating Example 1 | 250° C./120 S | 17.9 |
| Coating Example 1 | 300° C./120 S | 12.0 |
| Coating Example 1 | 350° C./120 S | 5.0 |

The etch rate of the material of the Example 1 demonstrated much better etch resistance than that of silicon oxide material in $CF_4$ gas under similar conditions. By increasing baking temperature, the etch resistance of MHM materials can be improved especially in plasma gases due to higher metal content in the films.

We claim:

1. A composition comprising:
   a metal salt solution comprising:
      a metal ion selected from the group consisting of Zr, Al, Ti, Hf, W, Mo, Sn, In, Ga, Zn and combinations thereof; and
      a counter ion selected from the group consisting of nitrates, sulfates, acetates, fluorinated alkylacetates, fluorinated alkylsulfonates, acrylates, methacrylates and combinations thereof; and
      a solvent;
   a stabilizer comprising a lactone, wherein the stabilizer is present in the composition at a content of not more than 10 wt %; and
   an optional additive selected from the group consisting of catalysts, crosslinkers, photoacid generators, organic polymers, inorganic polymers, surfactants, wetting agents, anti-foam agents, thixotropic agents and combinations thereof.

2. The composition of claim 1 wherein the composition has an organic content from the counterion and optional additive that is no more than 25 wt %.

3. The composition of claim 1 having a total solid content ranging from 2 wt % to 40 wt %.

4. The composition of claim 1 wherein the metal ion is Zr.

5. The composition of claim 1 wherein the metal ion is Al.

6. The composition of claim 1 wherein the counterion is selected from the group consisting of alkylsulfonates and nitrates.

7. The composition of claim 1 wherein the metal salt is selected from the group consisting of zirconyl nitrate, aluminum nitrate, zirconyl methacrylate, aluminum sulfate, titanium oxysulfate, aluminum trifluoroacetate, aluminum trifluoromethylsulfonate, and combinations thereof.

8. The composition of claim 1 wherein the solvent is selected from the group consisting of water, alcohols, esters, alkylcarboxylic acids, ketones, lactones, diketones, and combinations thereof.

9. The composition of claim 1 wherein the lactone is selected from the group consisting of α-acetolactone, β-propiolactone, gamma-valerolactone, gamma-butyrolactone and combinations thereof.

10. The composition according to claim 1 wherein the organic content from the counterion and optional additive is not more than 10 wt %.

11. The composition according to claim 1 wherein the organic content from the counterion and optional additive is not more than 5 wt %.

12. A process for making an aluminum trifuoromethylsulfonate composition comprising the step of dissolving aluminum trifluoromethylsulfonate in a mixture comprising a solvent and a lactone to form a solution of aluminum trifluoromethylsulfonate in the mixture comprising the lactone and the solvent.

13. A process for coating a substrate comprising the steps of:
   applying a composition on the substrate; and
   heating the coated substrate to form a cured film,
   wherein the composition comprises:
      a metal salt solution comprising:
         a metal ion selected from the group consisting of Ti, Zr, Hf, W, Mo, Sn, Al, In, Ga, Zn and combinations thereof; and
         a counter ion selected from the group consisting of nitrates, sulfates, acetates, fluorinated alkylacetates, fluorinated alkylsulfonates, acrylates, methacrylates and combinations thereof; and
         a solvent;
      a stabilizer comprising a lactone, wherein the stabilizer is present in the composition at a content of not more than 10 wt %; and
      an optional additive selected from the group consisting of catalysts, crosslinkers, photoacid generators, organic polymers, inorganic polymers, surfactants, wetting agents, anti-foam agents, thixotropic agents and combinations thereof.

* * * * *